(12) United States Patent
Kim

(10) Patent No.: US 8,222,711 B2
(45) Date of Patent: Jul. 17, 2012

(54) IMAGE SENSOR AND METHOD FOR MANUFACTURING THE SAME

(75) Inventor: Tae Gyu Kim, Gyeongsangnam-do (KR)

(73) Assignee: Dongbu Hitek Co., Ltd., Seoul (KR)

( * ) Notice: Subject to any disclaimer, the term of this patent is extended or adjusted under 35 U.S.C. 154(b) by 442 days.

(21) Appl. No.: 12/508,196

(22) Filed: Jul. 23, 2009

(65) Prior Publication Data

US 2010/0025803 A1  Feb. 4, 2010

(30) Foreign Application Priority Data

Jul. 29, 2008  (KR) .................. 10-2008-0074169

(51) Int. Cl.
*H01L 31/102* (2006.01)
(52) U.S. Cl. ........ 257/458; 257/292; 257/290; 257/293; 257/E31.061; 257/E21.211; 438/98
(58) Field of Classification Search .................. 257/233, 257/292, 293, 300, 458, E33.076, E33.077, 257/E31.061, E31.058, E31.081–E31.085, 257/E31.121, E27.133–E27.163, E25.032, 257/E21.211; 438/48, 49, 57, 98
See application file for complete search history.

(56) References Cited

U.S. PATENT DOCUMENTS

| | | | |
|---|---|---|---|
| 6,762,401 B2 * | 7/2004 | Lee | 250/208.1 |
| 6,902,946 B2 * | 6/2005 | Theil | 438/48 |
| 7,276,749 B2 * | 10/2007 | Martin et al. | 257/292 |
| 7,309,865 B2 * | 12/2007 | Ikushima et al. | 250/338.1 |
| 7,675,101 B2 * | 3/2010 | Hwang | 257/292 |
| 7,875,917 B2 * | 1/2011 | Kim | 257/292 |
| 7,884,401 B2 * | 2/2011 | Shim | 257/292 |
| 2008/0083939 A1 * | 4/2008 | Guidash | 257/292 |
| 2008/0093695 A1 * | 4/2008 | Gao et al. | 257/428 |
| 2009/0065829 A1 * | 3/2009 | Kim | 257/292 |
| 2009/0166792 A1 * | 7/2009 | Shim et al. | 257/462 |
| 2010/0026863 A1 * | 2/2010 | Kim | 348/294 |

* cited by examiner

*Primary Examiner* — Telly Green
(74) *Attorney, Agent, or Firm* — Saliwanchik, Lloyd & Eisenschenk

(57) ABSTRACT

Provided are an image sensor and a method for manufacturing the same. According to an embodiment, a semiconductor substrate is provided comprising a readout circuit. An interconnection electrically connected to the readout circuit and an interlayer dielectric are disposed over the semiconductor substrate. An image sensing unit is disposed over the interlayer dielectric and comprises a first doping layer and a second doping layer stacked therein. A first via hole is formed, exposing the interconnection through the image sensing unit. A fourth metal contact is formed in the first via hole to electrically connect the interconnection and the first doping layer. A fifth metal contact is formed over the fourth metal contact, the fifth metal contact being electrically insulated from the fourth metal contact and electrically connected to the second doping layer.

7 Claims, 7 Drawing Sheets

IMAGE SENSOR AND METHOD FOR MANUFACTURING THE SAME

CROSS-REFERENCE TO RELATED APPLICATION

This application claims the benefit under 35 U.S.C. §119 to Korean Patent Application No. 10-2008-0074169, filed Jul. 29, 2008, which is hereby incorporated by reference in its entirety.

BACKGROUND

The present disclosure relates to an image sensor.

An image sensor is a semiconductor device for converting an optical image into an electric signal. The image sensor may be roughly classified into a charge coupled device (CCD) image sensor and a complementary metal oxide semiconductor (CMOS) image sensor (CIS).

The CMOS image sensor includes a photodiode region converting a received optical signal into an electrical signal, and a transistor region processing the electrical signal, wherein the photodiode region and the transistor region are disposed horizontally.

In such a horizontal image sensor, the photodiode region and the transistor region are disposed horizontally on a semiconductor substrate. Therefore, the horizontal image sensor has a limitation in expanding an optical sensing region in a limited area, which is generally referred to as a fill factor.

As an alternative to overcome this limitation, an attempt of forming a photodiode using amorphous silicon (Si), or forming a circuitry in a silicon (Si) substrate using a method such as wafer-to-wafer bonding, and forming a photodiode on and/or over the circuitry has been made (referred to as a three-dimensional (3D) image sensor). The photodiode is connected with the circuitry through a metal interconnection.

However, a bonding strength between wafers may be reduced due to uneven boding surface of the wafer. That is, since the metal interconnections between the photodiode and circuitry are exposed on the surface of an interlayer dielectric, the interlayer may have an uneven surface profile. This results in the reduction of the bonding strength with the photodiode formed on the interlayer dielectric.

BRIEF SUMMARY

Embodiments provide an image sensor that employs vertical integration of a readout circuit and a photodiode and improves the fill factor of the photodiode, and a method for manufacturing the same.

In one embodiment, an image sensor comprises: a semiconductor substrate comprising a readout circuit, an interconnection connected to the readout circuit, and an interlayer dielectric over the semiconductor substrate; an image sensing unit over the interlayer dielectric, the image sensing unit comprising a first doping layer and a second doping layer stacked therein; a first via hole exposing the interconnection through the image sensing unit; a fourth metal contact in the first via hole to electrically connect the interconnection and the first doping layer; and a fifth metal contact over the fourth metal contact, the fifth metal contact being electrically insulated from the fourth metal contact and electrically connected to the second doping layer.

In another embodiment, a method for manufacturing an image sensor comprises: forming an interconnection connected to a readout circuit and an interlayer dielectric over a semiconductor substrate comprising the readout circuit; forming an image sensing unit comprising a first doping layer and a second doping layer stacked over the interlayer dielectric; forming a first via hole penetrating the image sensing unit to expose the interconnection; forming a first barrier pattern at sidewalls of the first via hole to cover the second doping layer and partially expose the first doping layer; forming a fourth metal contact in the first via hole to electrically connect the interconnection and the first doping layer; forming a second barrier pattern over the fourth metal contact in the first via hole; and forming a fifth metal contact over the second barrier pattern and electrically connected to the second doping layer.

The details of one or more embodiments are set forth in the accompanying drawings and the description below. Other features will be apparent from the description and drawings, and from the claims.

DETAILED DESCRIPTION

In the description of embodiments, it will be understood that when a layer (or film) is referred to as being 'on' another layer or substrate, it can be directly on another layer or substrate, or intervening layers may also be present. Further, it will be understood that when a layer is referred to as being 'under' another layer, it can be directly under another layer, or one or more intervening layers may also be present. In addition, it will also be understood that when a layer is referred to as being 'between' two layers, it can be the only layer between the two layers, or one or more intervening layers may also be present.

Hereinafter, an image sensor and a method for manufacturing the same will be described with reference to the accompanying drawings.

The embodiment is not limited to a CMOS image sensor, but is applicable to any image sensor (e.g., a CCD image sensor) that requires a photodiode.

Figure 1:
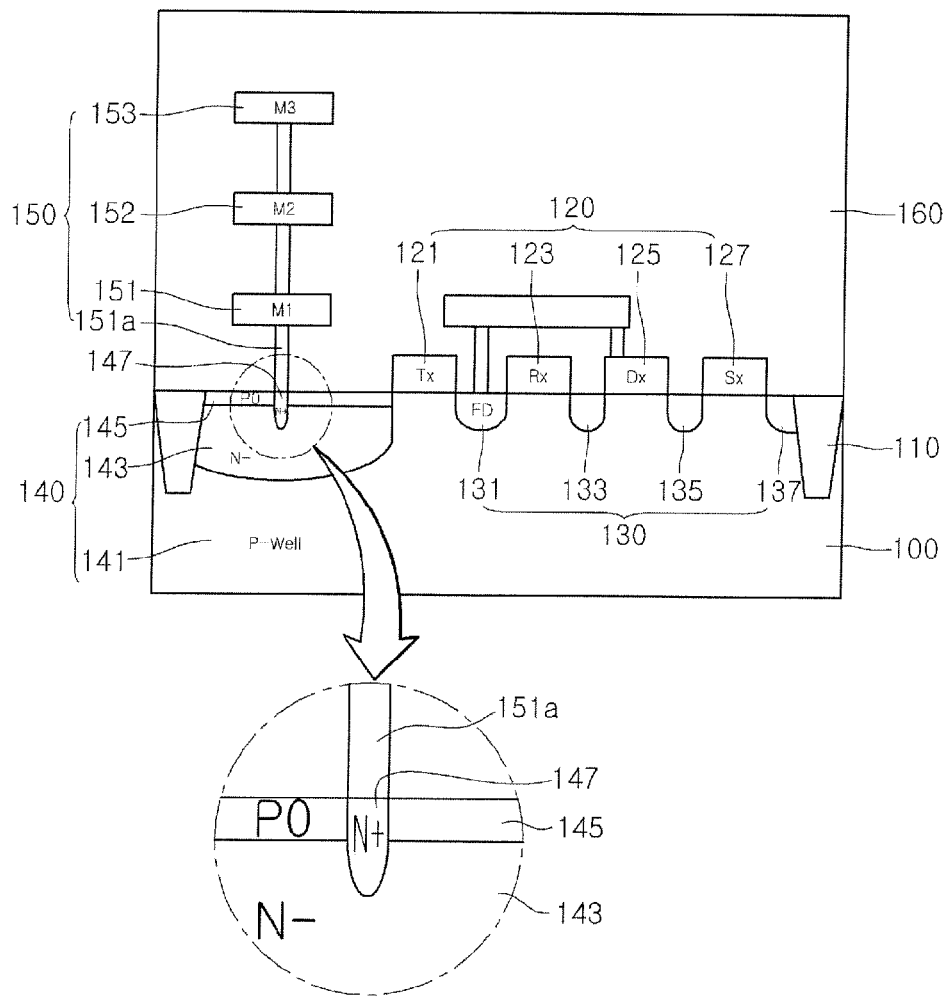
FIG. 1 is a cross-sectional view of an image sensor according to an embodiment.
Figure 3:
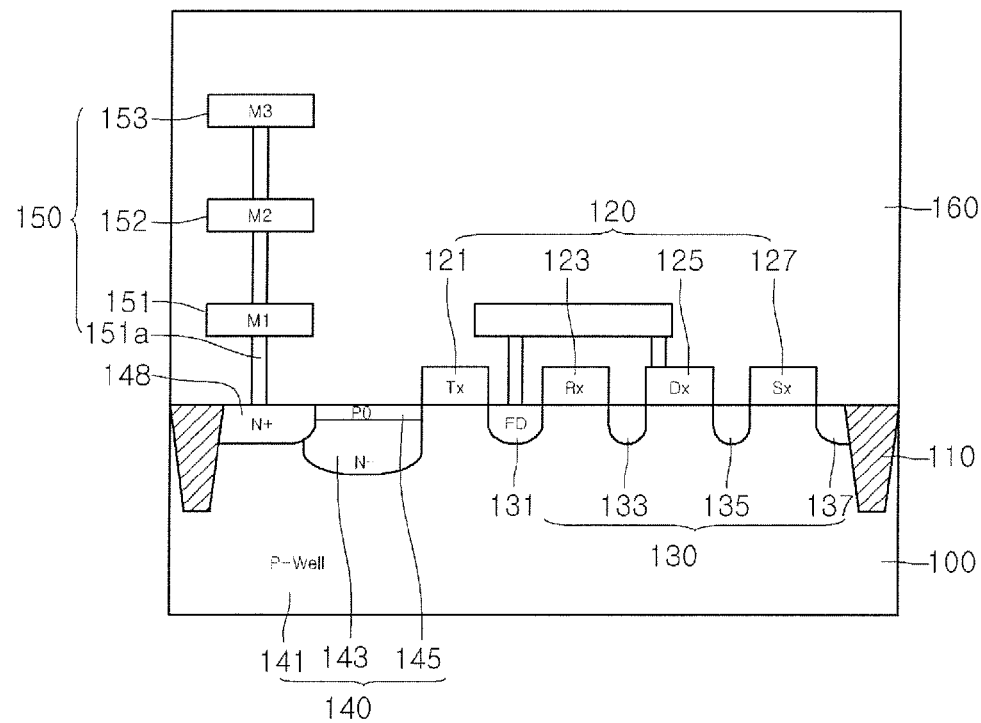
FIG. 3 is a cross-section view of an image sensor according to another embodiment.
Figure 12:
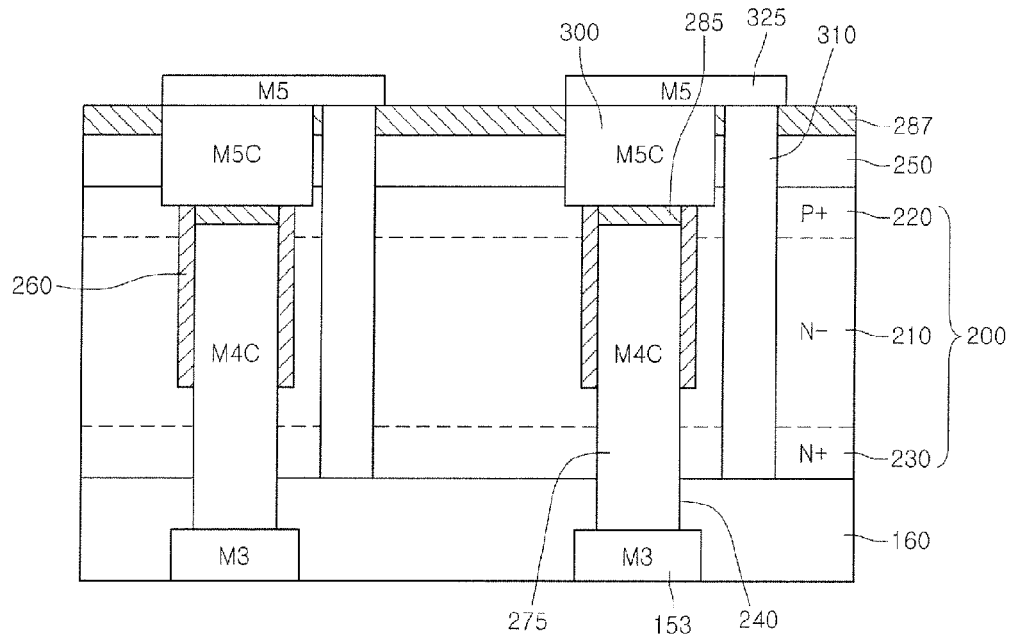

FIG. 12 shows a simplified cross-sectional view illustrating an image sensor according to an embodiment. FIGS. 1 and 3 show more detailed views of the substrate having a readout circuit and interconnections in accordance with certain embodiments of the present invention.

An image sensor according to an embodiment includes a semiconductor substrate 100 including a readout circuit 120, an interconnection 150 electrically connected to the readout circuit 120, and an interlayer dielectric 160 over the semiconductor substrate 100; an image sensing unit 200 over the interlayer dielectric 160, the image sensing unit 200 including a first doping layer 210 and a second doping layer 220 stacked therein; a first via hole 240 exposing the interconnection 150 through the image sensing unit 200; a fourth metal contact 275 in the first via hole to electrically connect the interconnection 150 and the first doping layer 210; and a fifth metal contact 300 over the fourth metal contact 275, electrically insulated from the fourth metal contact 275 and electrically connected to the second doping layer 220.

Since the fifth metal contact 300 is formed over the fourth metal contact 275, the fourth and fifth metal contacts 275 and 300 are aligned along the same line. Thus, the interconnections are formed in a minimum space of the image sensing unit 200, thereby improving the fill factor of the image sensing unit 200.

A pixel separation region 310 is formed in the image sensing unit 200 to separate the image sensing unit 200 by unit pixel.

Figure 13:
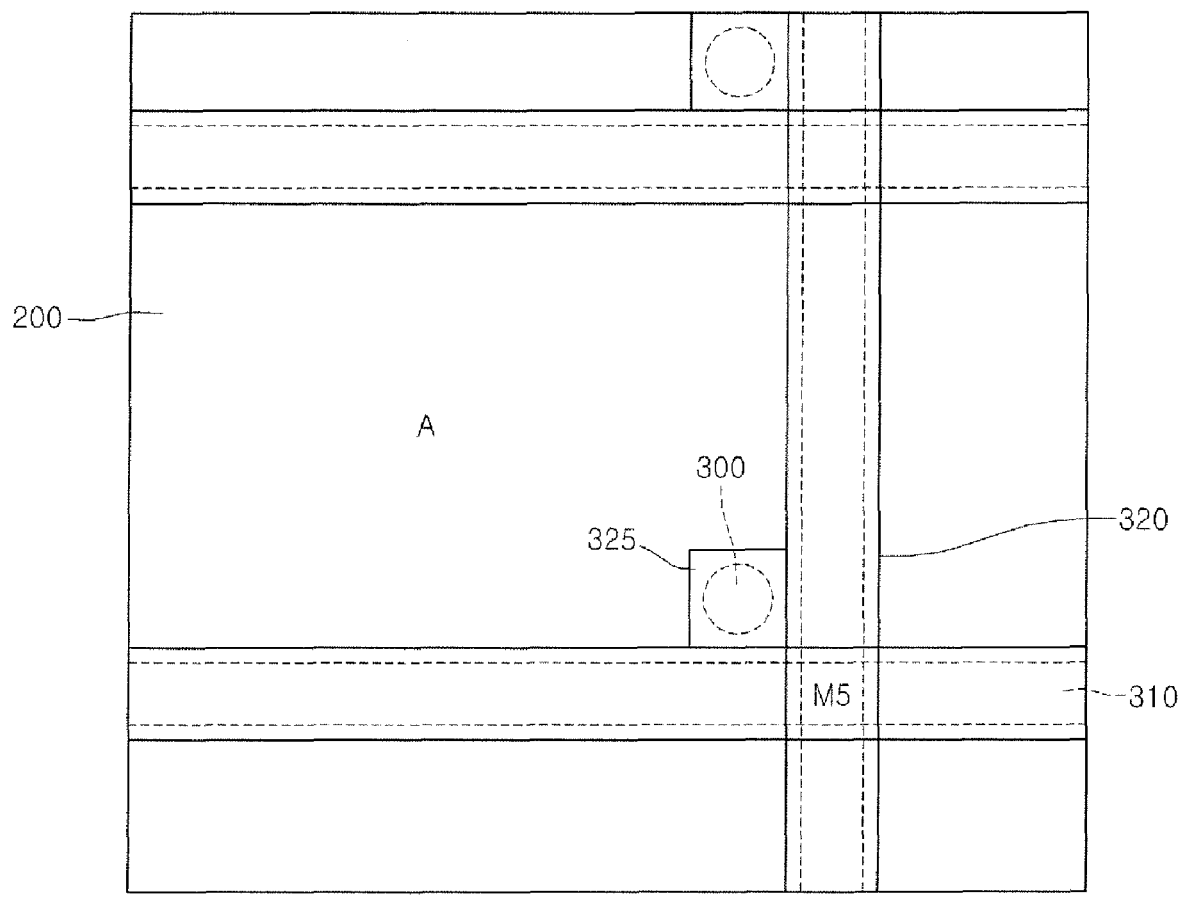
FIG. 13 is a plan view illustrating the image sensor of FIG. 12.

Particularly, since the pixel separation region 310 is formed to be adjacent to the fourth contact 275 and the fifth metal contact 300, the light receiving region of the image sensing unit 200 may be secured. Also, as shown in FIG. 13, the pixel separation region 310 may be formed in a mesh pattern to separate the image sensing unit 200 by unit pixel.

A fifth metal line 320 may be formed on the fifth metal contact 300 to deliver an electric signal to the fifth metal contact 300.

The fifth metal line 320 may be formed in a mesh pattern according to the formation position of the pixel separation region 310 to secure the light receiving region of the image sensing unit 200.

A first barrier pattern 260 may be formed on the side wall of the first via hole 240 to expose a portion of the first doping layer 210 and block the remaining portion of the first doping layer 210 and the second doping layer 220 from being contacted by the fourth metal contact 275.

A second barrier pattern 285 may be formed between the fourth metal contact 275 and the fifth metal contact 300 to electrically isolate the fourth metal contact 275 from the fifth metal contact 300.

A trench 290 may be formed in the second doping layer 220 corresponding to an upper part of the second barrier pattern 285. Accordingly, the fifth metal contact 300 may be formed in the trench 290 to be electrically connected to the second doping layer 220.

Unexplained reference numerals will be described with reference to the following manufacturing method.

Hereinafter, a method for manufacturing an image sensor according to an embodiment will be described with reference to FIGS. 1 to 13.

Referring to FIG. 1, an interconnection 150 and an interlayer dielectric 160 are formed over the semiconductor substrate 100 including a readout circuit 120.

The semiconductor substrate 100 may be a mono- or polycrystalline silicon substrate, and may be a substrate doped with P-type impurities or N-type impurities. For example, a device isolation layer 110 is formed in the semiconductor substrate 100 to define an active region. A readout circuit 120 including transistors for each unit pixel is formed in the active region.

The readout circuit 120 may be one of 3Tr, 4Tr, and 5Tr type circuit. For example, as a 4Tr circuit, the readout circuit 120 may include a transfer transistor (Tx) 121, a reset transistor (Rx) 123, a drive transistor (Dx) 125, and a select transistor (Sx) 127. An ion implantation region 130 including a floating diffusion region (FD) 131 and source/drain regions 133, 135 and 137 for the transistors may be formed.

The forming of the readout circuitry 120 on the first substrate 100 may include forming an electrical junction region 140 in the first substrate 100 and forming a first conductive connection 147 connected to the interconnection 150 at an upper part of the electrical junction region 140.

For example, the electrical junction region 140 may be a P-N junction 140, but embodiments are not limited thereto.

For example, the electrical junction region 140 may include a first conductive type ion implantation layer 143 formed on a second conductive type well 141 or a second conductive type epitaxial layer, and a second conductive type ion implantation layer 145 formed on the first conductive type ion implantation layer 143. For example, as shown in FIG. 1, the P-N junction 140 may be a P0(145)/N−(143)/P−(141) junction, but embodiments are not limited thereto. In addition, first substrate 100 may be a second conductive type substrate, but embodiments are not limited thereto.

According to an embodiment, the device is designed to have a potential difference between the source and drain of the transfer transistor (Tx), thereby enabling the full dumping of a photo charge. Accordingly, photo charges generated in the photodiode are dumped to a floating diffusion region, thereby increasing the output image sensitivity.

That is, this embodiment forms the electrical junction region 140 in the first substrate 100 including the readout circuit 120 to provide a potential difference between the source and drain of the transfer transistor (Tx) 121, thereby enabling the full dumping of the photo charges.

Figure 2:
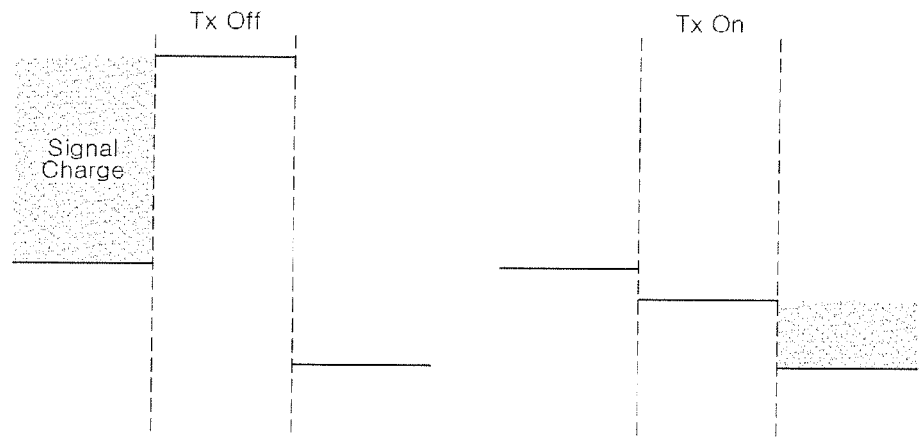
FIG. 2 shows a plot of voltage potential for explaining a transistor operation in accordance with an embodiment.

Hereinafter, a dumping structure of a photo charge according to an embodiment will be described in detail with reference to FIGS. 1 and 2.

In an embodiment, unlike a floating diffusion (FD) 131 node of an N+ junction, the P/N/P junction 140 of the electrical junction region 140 is pinched off at a predetermined voltage without an applied voltage being fully transferred thereto. This voltage is referred to as a pinning voltage. The pinning voltage depends on the P0 (145) and N− (143) doping concentration.

Specifically, electrons generated in the photodiode are transferred to the PNP junction 140, and they are transferred to the floating diffusion (FD) 131 node to be converted into a voltage when the transfer transistor (Tx) 121 is turned on.

The maximum voltage of the P0/N−/P− junction 140 becomes the pinning voltage, and the maximum voltage of the FD 131 node becomes Vdd minus the threshold voltage (Vth) of the reset transistor (Rx). As illustrated in FIG. 2, due to a potential difference between the source and drain of the Tx 121, without charge sharing, electrons generated in the photodiode at upper part of the chip can be completely dumped to the FD 131 node.

That is, in an embodiment, instead of an N+/P-well junction a P0/N−/P-well junction is formed in a silicon substrate (Si-Sub) of the semiconductor substrate 100. The reason for this is that, in a 4-Tr active pixel sensor (APS) reset operation, a positive (+) voltage is applied to the N− region (143) in the P0/N−/P-well junction and a ground voltage is applied to the P0 region (145) and the P-well (141) and thus a P0/N−/P-well double junction generates a pinch-off at a predetermined voltage or higher like in a BJT structure. This is called the pinning voltage. Thus, a potential difference occurs between the source and drain of the Tx 121, thus making it possible to inhibit a charge sharing phenomenon due to full dumping of photocharges from N-well from to FD through Tx during the Tx on/off operation.

Thus, unlike the related art case of connecting a photodiode simply to an N+ junction, this embodiment makes it possible to inhibit saturation reduction and sensitivity degradation.

A first conductive connection 147 is formed between the photodiode and the readout circuit to create a smooth transfer path of a photo charge, thereby making it possible to minimize a dark current source and inhibit saturation reduction and sensitivity degradation.

To this end, an N+ doping region may be formed as a first conductive connection 147 for an ohmic contact on the surface of the P0/N−/P− junction 140. The N+ region (147) may be formed such that it pierces the P0 region (145) to contact the N− region (143).

In addition, the width of the first conductive connection 147 may be minimized to inhibit the first conductive connection 147 from being a leakage source.

To this end, a plug implant can be performed after etching a contact hole for a first metal contact 151a, but embodiments are not limited thereto. As another example, an ion implantation pattern (not shown) may be formed, and the pattern may be used as an ion implantation mask to form the first conductive connection 147.

That is, a reason why an N+ doping is locally performed only on a contact formation region is to minimize a dark signal and implement the smooth formation of an ohmic contact. If the entire Tx source region is N+ doped, a dark signal may increase due to an Si surface dangling bond.

FIG. 3 illustrates another structure of a readout circuit. As shown in FIG. 3, a first conductive connection region 148 may be formed at one side of the electric junction region 140.

Referring to FIG. 3, An N+ connection region 148 may be formed for an ohmic contact with a P0/N−/P− junction 140. A leakage source may be generated during the formation process of an N+ connection region 148 and a M1C contact 151a in the embodiment shown in FIG. 1. This is because an electric field (EF) may be generated over the Si surface due to operation while a reverse bias is applied to P0/N−/P− junction 140. A crystal defect generated during the contact formation process inside the electric field may become a leakage source.

Also, when the N+ connection region 148 is formed over the surface of P0/N−/P− junction 140, an electric field may be additionally generated due to N+/P0 junction 148/145. This electric field may also become a leakage source.

Accordingly, in the embodiment shown in FIG. 3, a layout is provided in which the first contact plug 151a is formed on an active region not doped with a P0 layer but including the N+ connection region 148 that is electrically connected to the N-junction 143.

In this embodiment, the electric field is not generated over the surface of the semiconductor substrate 100, which can contribute to reduction of a dark current of a 3D integrated CIS.

Referring again to FIGS. 1 and 3, an interlayer dielectric 160 and an interconnection 150 may be formed over the semiconductor substrate 100. The interconnection 150 may include a second metal contact 151a, a first metal 151, a second metal 152, and a third metal 153, but embodiments are not limited thereto. After formation of the third metal 153, a dielectric layer may be formed to cover the third metal 153 and a planarization process may be performed to form the interlayer dielectric 160. Thus, the surface of the interlayer dielectric 160 having a uniform surface profile may be exposed on the semiconductor substrate 100.

Figure 4:
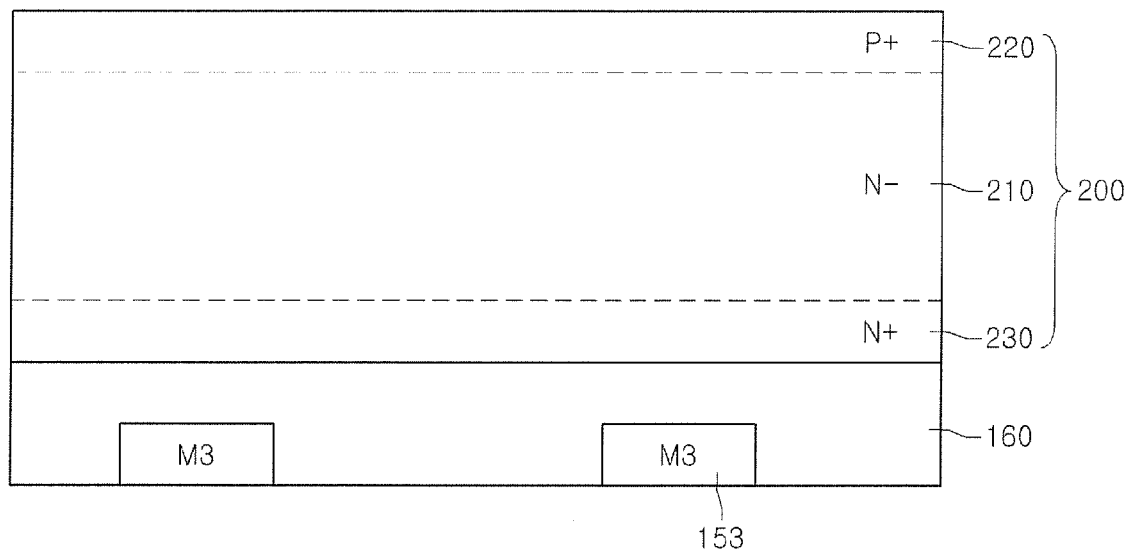
FIGS. 4 to 12 are cross-sectional views illustrating a process of manufacturing an image sensor according to an embodiment.

Referring to FIG. 4, an image sensing unit 200 is formed on the interlayer dielectric 160 of the semiconductor substrate 100. The image sensing unit 200 may include a first doping layer 210 and a second doping layer 220 to have a PN junction photodiode structure. Also, an ohmic contact layer (N+) 230 may be formed under the first doping layer 210.

For reference, the third metal 153 and the interlayer dielectric 160 described in FIG. 4 represent a portion of the interconnection 150 and the interlayer dielectric 160 described in FIG. 1. That is, for convenience of explanation, a portion of the readout circuit 120 and the interconnection 150 has been omitted herein.

For example, the image sensing unit 200 may be formed in a stacked structure of the first doping layer 210 and the second doping layer 220 by ion-implanting N-type impurities (N−) and P-type impurities (P+) by turns into a crystalline P-type carrier substrate (not shown). In addition, high-concentration N-type impurities (N+) may be ion-implanted at a surface of the first doping layer 210 to form the ohmic contact layer 230. The ohmic contact layer 230 may reduce the contact resistance between the image sensing unit 200 and the interconnection 150.

In the embodiment, the first doping layer 210 may be formed to have a broader (wider) region than the second doping layer 220. In such embodiments, the depletion region thereof is expanded to increase the generation of photoelectrons.

After disposing the ohmic contact layer 230 of the carrier substrate (not shown) on the dielectric interlayer 160, a bonding process is performed to bond the semiconductor substrate 100 and the carrier substrate. Then, for embodiments where the carrier substrate has a hydrogen layer therein, the carrier substrate is removed through a cleaving process to expose the image sensing unit 200 bonded to the interlayer dielectric 160.

Accordingly, the image sensing unit 200 may be disposed over the readout circuit 120, thereby increasing a fill factor and inhibiting a defect in the image sensing unit 200. Also, the image sensing unit 200 is bonded to the surface of the interlayer dielectric 160 having a uniform surface profile, thereby increasing the bonding strength.

Figure 5:
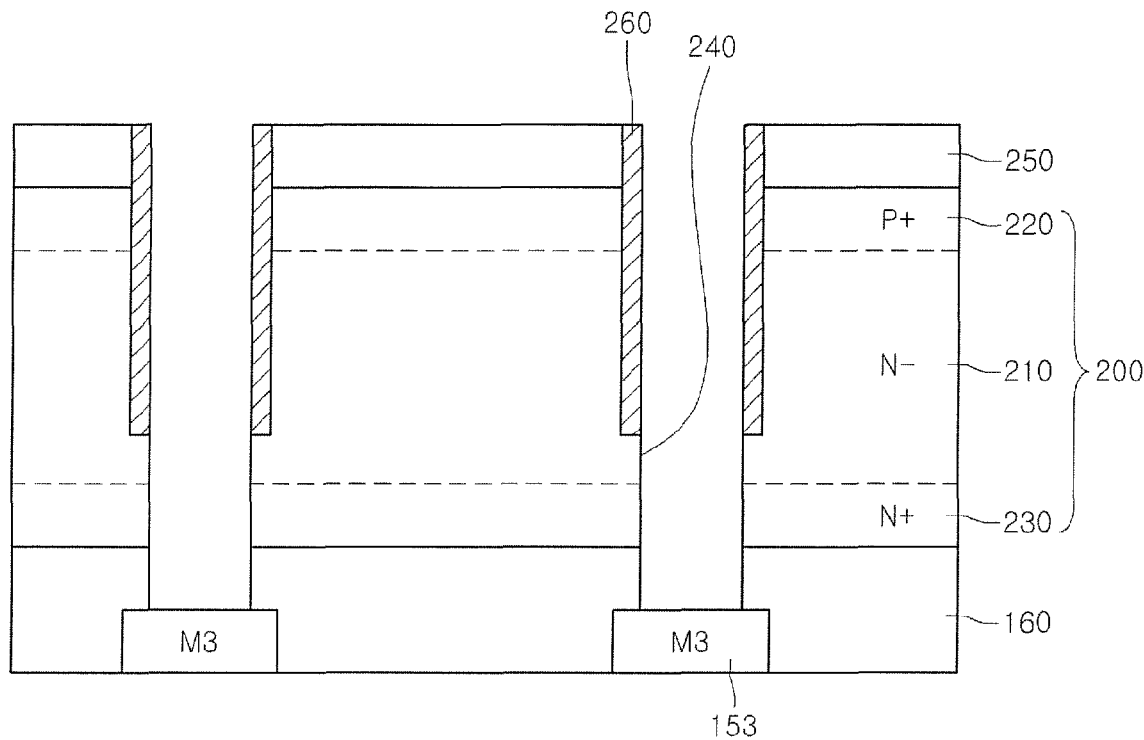

Referring to FIG. 5, a first via hole 240 penetrating the image sensing unit 200 and the interlayer dielectric 160 is formed. The first via hole 240 is a deep via hole capable of exposing the surface of the third metal 153.

A first barrier pattern 260 is formed on the side wall of the first via hole 240 corresponding to a portion of the first doping layer 210 and the second doping layer 220 of the image sensing unit 200. The barrier pattern 260 may be formed of an oxide or a nitride.

That is, the first barrier pattern 260 covers all the second doping layer 220 and a portion of the first doping layer 210 adjacent to the second doping layer 220. A portion of the first doping layer 210 and the ohmic contact layer 230 are exposed to the first via hole 240.

Although not shown, a method of forming the first via hole 240 and the first barrier pattern 260 will be described as follows. After a hard mask 250 patterned for unit pixel is formed on the image sensing unit 200, the image sensing unit 200 is etched using the hard mask 250 to form an initial via hole (not shown) at a region corresponding to the third metal 153. The initial via hole (not shown) extends only a portion into the image sensing unit to expose the second doping layer 220 and partially expose the first doping layer 210 corresponding to a region over the third metal 153. After a first barrier layer (not shown) is formed in the initial via hole (not shown), an etching process is performed to remove the first barrier layer from the bottom surface of the initial via hole (and the top surface of the hard mask 250), forming the first barrier pattern 260 only on the side walls of the initial via hole. Then, the first via hole 240 may be formed to expose the third metal 153 through the image sensing unit 200 and the interlayer dielectric 160 using the hard mask 250 and the first barrier pattern 260 as an etching mask.

Figure 6:
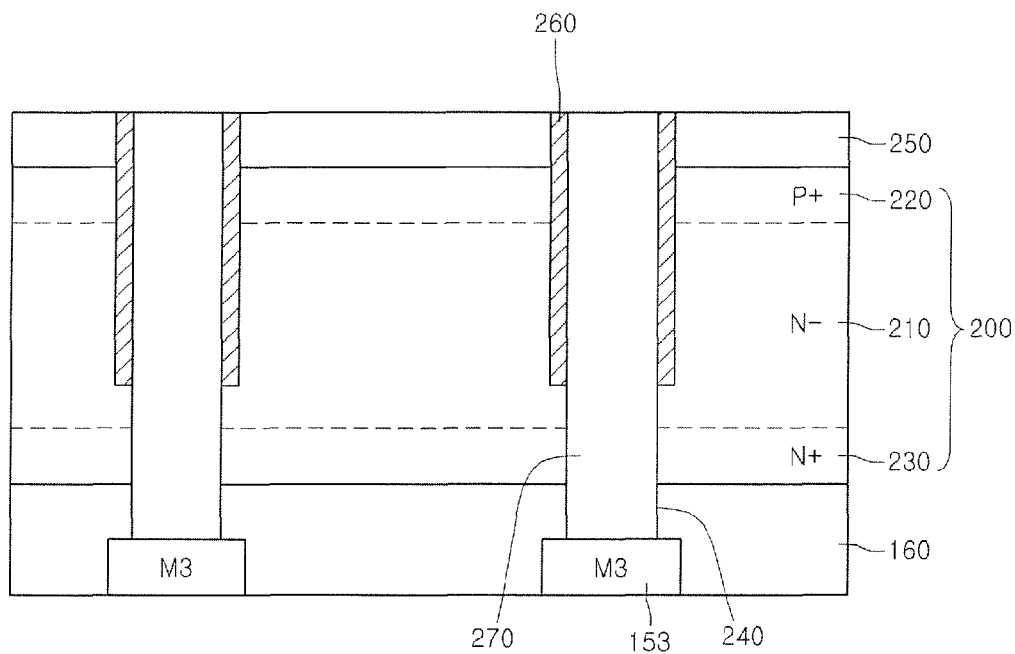

Referring to FIG. 6, a contact plug 270 is formed to electrically connect the image sensing unit 200 and the readout circuit 120. The contact plug 270 may be formed of at least one of metal materials such as Cu, Al, Ti, Ta, TiN, TaN, and W.

The contact plug 270 may be electrically connected to the third metal 153 by penetrating the image sensing unit 200 and the interlayer dielectric 160 through the first via hole 240.

Also, the barrier pattern 260 is partially formed on the side walls of the contact plug to electrically isolate the contact plug 270 from the second doping layer 220.

Accordingly, photo charges generated in the image sensing unit 200 may be delivered to the readout circuit 120 through the contact plug 270. Also, since the first barrier pattern 260 isolates the contact plug 270 from the second doping layer 220, the image sensing unit 200 may be normally operated.

Figure 7:
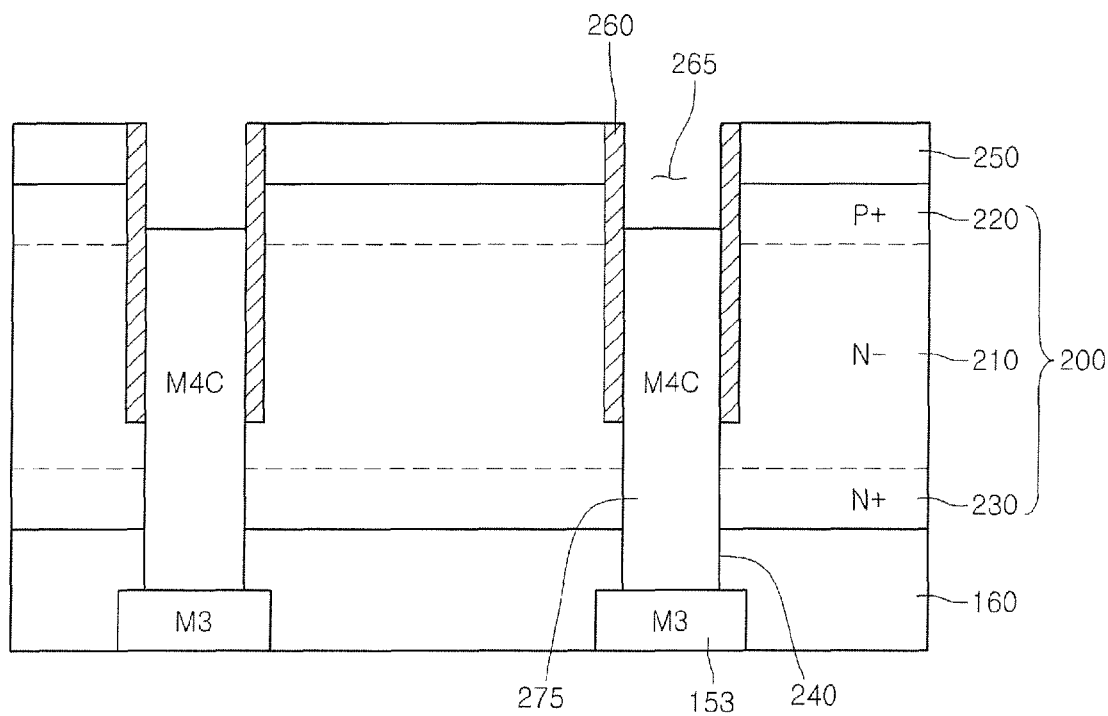

Referring to FIG. 7, a second via hole 265 and a fourth metal contact (M4C) 275 are formed by removing the upper part of the contact plug 270. The second via hole 265 formed by selectively etching the contact plug 270 to a depth corresponding to the second doping layer 220 may expose the first barrier pattern 260 at sides of the second doping layer 220. For example, the second via hole 265 may be formed to expose the first barrier pattern 260 to a depth corresponding to the second doping layer 220 by controlling a recess process. The fourth metal contact 275 is the contact plug 270 remaining under the via hole 265.

Figure 8:
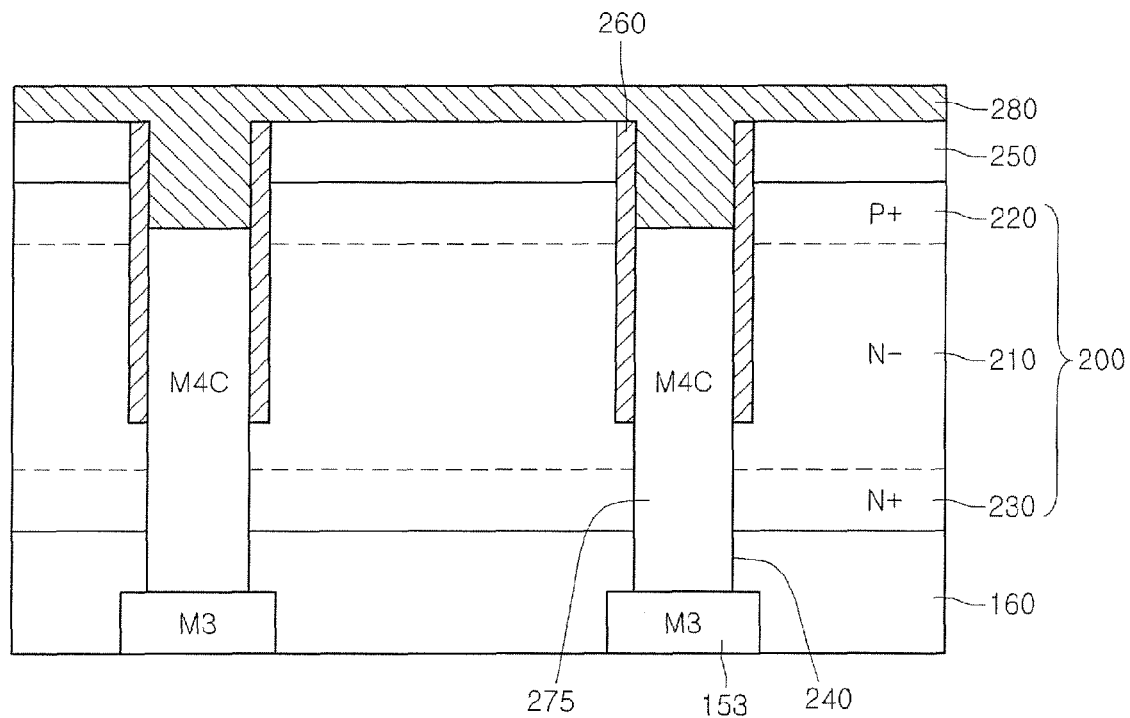

Referring to FIG. 8, a second barrier layer 280 is formed in the second via hole 265 and over the image sensing unit 200. After the second barrier layer 280 covers the second via hole 265 and the hard mask 250, a planarization process is performed on the second barrier layer 280. In this case, since the second barrier layer 280 fills the second via hole 265, the second barrier layer 280 is filled over the fourth metal contact 275.

The second barrier layer 280 may be formed of an oxide or a nitride.

Figure 9:
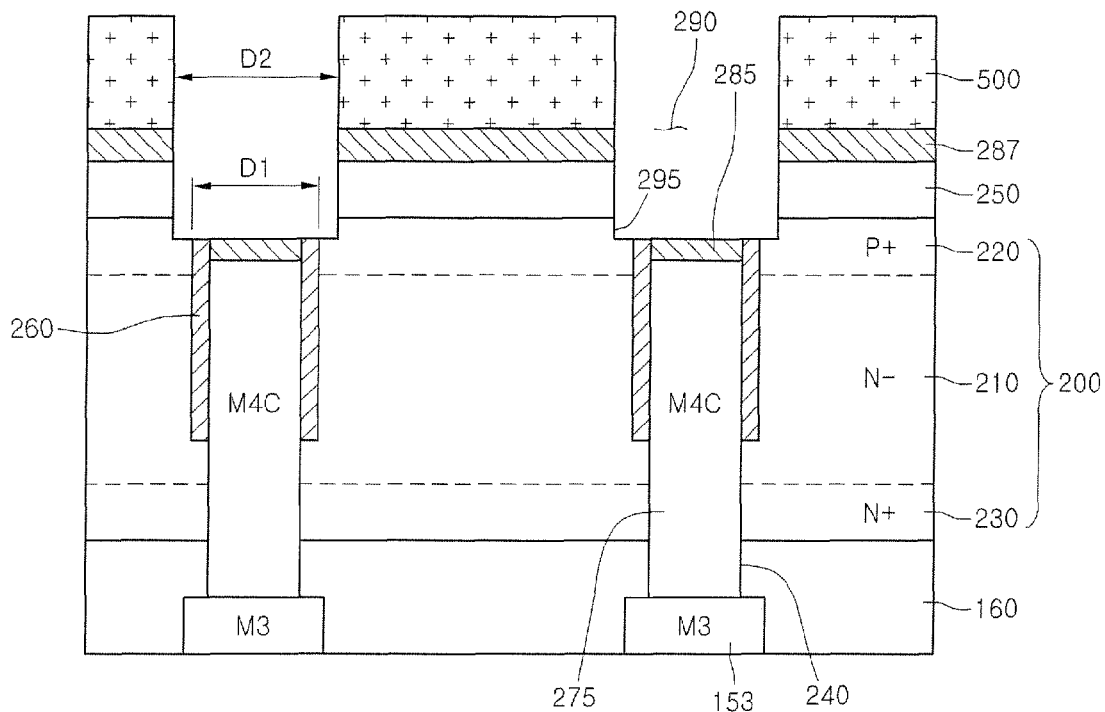

Referring to FIG. 9, a trench 290 is formed to selectively expose the second doping layer 220 of the image sensing unit 200. The remaining second barrier layer 280 below the trench 290 forms the second barrier pattern 285 and is disposed between the bottom of the trench 290 and the fourth metal contact 275.

In order to form the trench 290, a photoresist pattern 500 exposing the second barrier layer 280 corresponding to the fourth metal contact 275 is formed on the second barrier layer 280. In this case, the photoresist pattern 500 may be formed to have a width D2 greater than a width D1 of the first via hole 240 including the first barrier pattern 260. The trench 290 may be formed by etching the exposed second barrier layer 280, the hard mask 250, and the second doping layer 220 using the photoresist pattern 500 as an etching mask. Here, the etching process may be stopped by the control of etching conditions if a portion of the second doping layer 220 is exposed. Also, since the photoresist pattern 500 has a width greater than that of the first via hole 240, the second doping layer 200 may be exposed at the edge regions 290 of the bottom of the trench 290.

If a portion of the second doping layer 220 is exposed by the control of the etching process during the formation of the trench 290, then the etching is stopped, and the second barrier pattern 285 is formed under the trench 290.

After this, when the photoresist pattern 500 is removed, a third barrier pattern 287, which is the portion of the barrier layer 280 that was covered by the photoresist pattern 500, is exposed.

Figure 10:
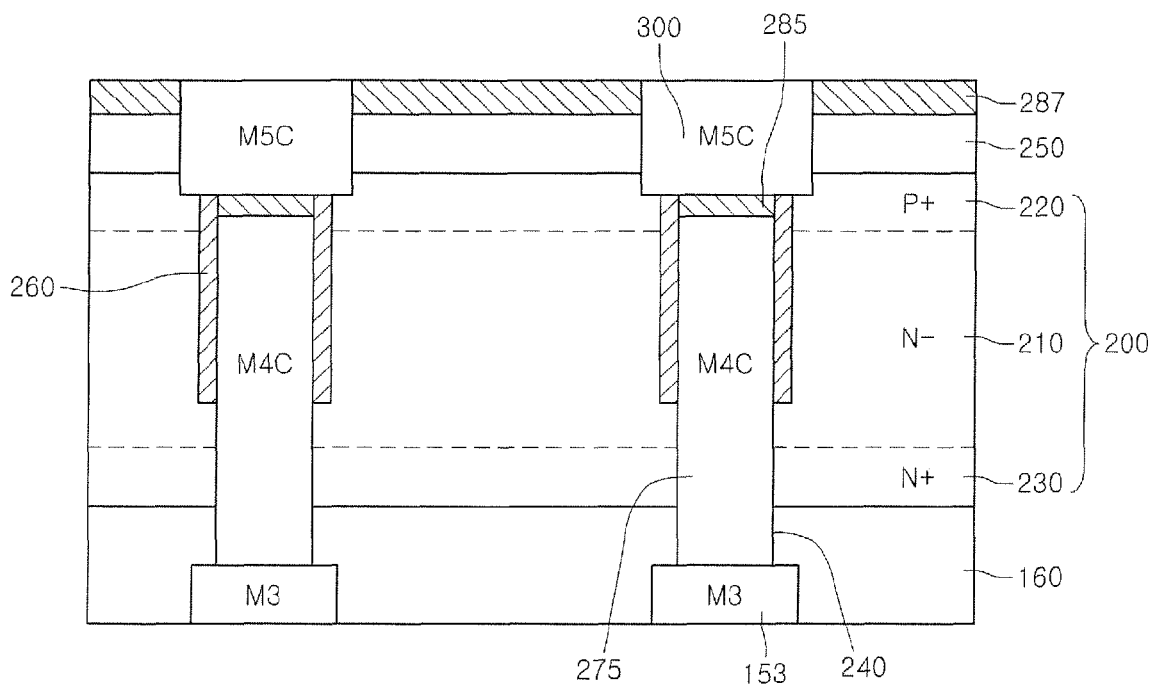

Referring to FIG. 10, a fifth metal contact (M5C) 300 is formed in the trench 290. The fifth metal contact 300 is formed in the trench 290 to be electrically connected to the second doping layer 220.

The fifth metal contact 300 may be formed by performing a planarization process after a metal layer is deposited on the image sensing unit 200 including the trench 290. For example, the planarization process may be a chemical mechanical (CMP) process, and a polishing end point may be the third barrier pattern 287. Also, the fifth metal contact 300 may be formed of one of metal material such as Cu, Al, Ti, Ta, TiN, TaN, and W.

The fifth metal contact 300 is formed in the trench 290 to be electrically connected to only the second doping layer 220 of the image sensing unit 200 and serve as a ground contact.

Since the fifth metal contact 300 is electrically isolated from the fourth metal contact 275 by the second barrier pattern 285, a ground voltage may be applied to only the second doping layer 220.

As described above, the fourth metal contact 275 is electrically isolated from the fifth metal contact 300 by the second barrier pattern 285. Because the fourth metal contact 275 is electrically connected to a portion of the first doping layer 210 and/or the ohmic contact layer 230 due to the first barrier pattern 260, photo charges generated in the image sensing unit 200 may be delivered to the readout circuit 120 through the fourth metal contact 275.

Also, since the second barrier pattern 285 is interposed between the fourth metal contact 275 and the fifth metal contact 300, a light receiving region of the image sensing unit 200 can be secured, thereby improving the fill factor. That is, since the fourth metal contact 275 and the fifth metal contact are aligned along the same line, the light receiving region of the image sensing unit 200 can be maximally secured.

Figure 11:
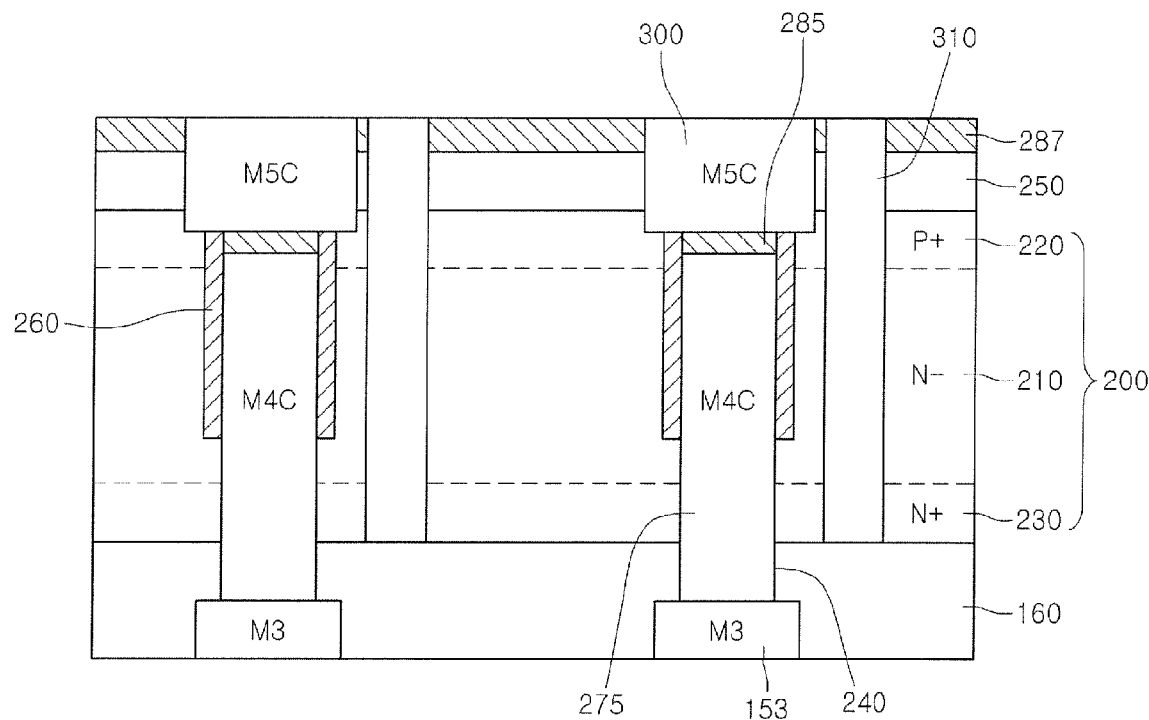

Referring to FIG. 11, a pixel separation region 310 is formed in the image sensing unit 200 to separate the image sensing unit 200 by unit pixel. The pixel separation region 310 is formed to penetrate the image sensing unit 200 thoroughly to separate the image sensing unit 200 by unit pixel. The pixel separation region 310 may be formed adjacent to the fourth metal contact 275 and the fifth metal contact 300.

The pixel separation region 310 may be formed through a shallow trench isolation (STI) process or an ion implantation process. For example, in the STI process, the pixel separation region 310 may be formed by filling an insulating material in a trench formed in the image sensing unit 200.

Referring to FIG. 12, a fifth metal 325 is formed on the fifth metal contact 300. The fifth metal 325 may be formed to be electrically connected to the fifth metal contact 300 by performing a patterning after a metal layer is deposited. The fifth metal 325 may be formed on the fifth metal contact 300 and the pixel separation region 310.

As shown in FIG. 13, the fifth metal 325 may be formed by performing a patterning such that a portion of a fifth metal line 320 is connected to the fifth metal 325 during formation of the fifth metal line 320.

The fifth metal line 320 may be formed in a mesh pattern along the formation line of the pixel separation region 310. Since the fifth metal 325 is formed at the fifth metal line 320 corresponding to an edge region of the pixel separation region 310, a light receiving region of the image sensing unit 220 can be maximally secured.

As shown in FIG. 13, the fifth metal 325 and the fifth metal contact 300 are formed at the edge region of the image sensing unit 200 corresponding to a unit pixel A. Although not shown, a fourth metal contact 275 is formed under the fifth metal contact 300, where a second barrier layer 280 is interposed.

As described above, the fifth metal contact 300 and the fifth metal 325 are formed over the fourth metal contact 275, and the fourth and fifth metal contacts 275 and 300 are formed adjacent to the pixel separation region 310. Accordingly, the light receiving region of the image sensing unit 200 corresponding to a unit pixel can be maximally secured, thereby improving the fill factor of the image sensor. Thus, sensitivity and saturation characteristics of the image sensor can be improved.

Although not shown, a color filter and a microlens may be additionally formed over the image sensing unit 200.

Any reference in this specification to "one embodiment", "an embodiment," "example embodiment," etc., means that a particular feature, structure, or characteristic described in connection with the embodiment is included in at least one embodiment of the invention. The appearances of such phrases in various places in the specification are not necessarily all referring to the same embodiment. Further, when a particular feature, structure, or characteristic is described in connection with any embodiment, it is submitted that it is within the purview of one skilled in the art to effect such feature, structure, or characteristic in connection with other ones of the embodiments.

Although embodiments have been described with reference to a number of illustrative embodiments thereof, it should be understood that numerous other modifications and embodiments can be devised by those skilled in the art that will fall within the spirit and scope of the principles of this disclosure. More particularly, various variations and modifications are possible in the component parts and/or arrangements of the subject combination arrangement within the scope of the disclosure, the drawings and the appended claims. In addition to variations and modifications in the component parts and/or arrangements, alternative uses will also be apparent to those skilled in the art.

What is claimed is:

1. An image sensor comprising:
   a semiconductor substrate comprising a readout circuit;
   an interconnection connected to the readout circuit and an interlayer dielectric over the semiconductor substrate;
   an image sensing unit over the interlayer dielectric, the image sensing unit comprising a first doping layer and a second doping layer stacked therein;
   a first via hole exposing the interconnection through the image sensing unit;
   a fourth metal contact in the first via hole to electrically connect the interconnection and the first doping layer; and
   a fifth metal contact over the fourth metal contact, the fifth metal contact being electrically insulated from the fourth metal contact and electrically connected to the second doping layer.

2. The image sensor according to claim 1, further comprising a pixel separation region penetrating the image sensing unit to separate the image sensing unit by unit pixel, the pixel separation region being formed adjacent to the fourth metal contact and the fifth metal contact.

3. The image sensor according to claim 2, further comprising a fifth metal line formed over the fifth metal contact and electrically connected to the fifth metal contact.

4. The image sensor according to claim 3, wherein fifth metal line is formed in a mesh pattern according to a formation position of the pixel separation region.

5. The image sensor according to claim 1, further comprising a first barrier pattern on sidewalls of the first via hole while exposing a portion of the first doping layer and covering second doping layer and the remaining portion of the first doping layer.

6. The image sensor according to claim 1, further comprising a second barrier pattern between the fourth metal contact and the fifth metal contact.

7. The image sensor according to claim 6, wherein the fifth metal contact is formed in a trench exposing a portion of the second doping layer and the second barrier pattern.

\* \* \* \* \*